United States Patent
Cappelletti et al.

(10) Patent No.: US 12,114,580 B2
(45) Date of Patent: Oct. 8, 2024

(54) PHASE-CHANGE MEMORY CELL

(71) Applicants: STMICROELECTRONICS S.r.l., Agrate Brianza (IT); COMMISSARIAT A L'ENERGIE ATOMIQUE ET AUX ENERGIES ALTERNATIVES, Paris (FR)

(72) Inventors: Paolo Giuseppe Cappelletti, Seveso (IT); Gabriele Navarro, Moirans (FR)

(*) Notice: Subject to any disclaimer, the term of this patent is extended or adjusted under 35 U.S.C. 154(b) by 0 days.

(21) Appl. No.: 18/305,268

(22) Filed: Apr. 21, 2023

(65) Prior Publication Data

US 2023/0389450 A1 Nov. 30, 2023

Related U.S. Application Data

(63) Continuation of application No. 17/166,474, filed on Feb. 3, 2021, now Pat. No. 11,653,579.

(30) Foreign Application Priority Data

Feb. 6, 2020 (FR) ..................................... 2001192

(51) Int. Cl.
| | | |
|---|---|---|
| *G11C 11/00* | (2006.01) | |
| *G11C 13/00* | (2006.01) | |
| *H10N 70/00* | (2023.01) | |
| *H10N 70/20* | (2023.01) | |

(52) U.S. Cl.
CPC ....... *H10N 70/231* (2023.02); *G11C 13/0004* (2013.01); *G11C 13/0069* (2013.01); *H10N 70/8413* (2023.02); *H10N 70/8828* (2023.02); *G11C 2013/008* (2013.01)

(58) Field of Classification Search
CPC ............ H10N 70/231; H10N 70/8828; H10N 70/8413; G11C 13/0004; G11C 13/0069; G11C 2013/008
USPC ......................................................... 365/163
See application file for complete search history.

(56) References Cited

U.S. PATENT DOCUMENTS

| | | | |
|---|---|---|---|
| 6,742,387 B2* | 6/2004 | Hamamoto ............ | G01N 19/10 73/335.04 |
| 8,003,970 B2* | 8/2011 | Kim ..................... | H10N 70/826 257/3 |
| 8,080,439 B2* | 12/2011 | Martinez, Jr. ...... | G11C 13/0004 438/102 |
| 8,513,576 B2 | 8/2013 | Kim et al. | |

(Continued)

FOREIGN PATENT DOCUMENTS

| | | |
|---|---|---|
| CN | 101789489 A | 7/2010 |
| CN | 101924181 A | 12/2010 |

(Continued)

OTHER PUBLICATIONS

Koelmans el al., "Projected Phase-Change Memory Devices," *Nature Communications* 6:8181, Sep. 3, 2015. (7 pages).

*Primary Examiner* — Viet Q Nguyen
(74) *Attorney, Agent, or Firm* — Seed IP Law Group LLP

(57) ABSTRACT

Phase-change memory cells and methods of manufacturing and operating phase-change memory cells are provided. In at least one embodiment, a phase-change memory cell includes a heater and a stack. The stack includes at least one germanium layer or a nitrogen doped germanium layer, and at least one layer of a first alloy including germanium, antimony, and tellurium. A resistive layer is located between the heater and the stack.

18 Claims, 6 Drawing Sheets

(56) References Cited

U.S. PATENT DOCUMENTS

| | | | |
|---|---|---|---|
| 8,803,119 B2 | 8/2014 | Morikawa et al. | |
| 8,890,104 B2 | 11/2014 | Lee et al. | |
| 8,952,299 B2 * | 2/2015 | Kim | H10N 70/8413 |
| | | | 219/121.48 |
| 9,177,640 B2 | 11/2015 | Shintani et al. | |
| 10,529,922 B1 | 1/2020 | Howard et al. | |
| 10,541,271 B2 | 1/2020 | Cheng et al. | |
| 10,566,386 B2 | 2/2020 | Jeong | |
| 10,910,558 B2 | 2/2021 | Cappelletti et al. | |
| 11,139,430 B2 * | 10/2021 | Wu | H10B 63/00 |
| 11,152,569 B2 * | 10/2021 | Wu | G11C 13/003 |
| 11,227,992 B2 | 1/2022 | Cappelletti et al. | |
| 11,245,071 B2 | 2/2022 | Lin et al. | |
| 11,355,702 B2 | 6/2022 | Cappelletti et al. | |
| 11,653,579 B2 * | 5/2023 | Cappelletti | G11C 13/0004 |
| | | | 365/163 |
| 2002/0131309 A1 | 9/2002 | Nishihara et al. | |
| 2006/0001000 A1 | 1/2006 | Pinnow et al. | |
| 2006/0113520 A1 * | 6/2006 | Yamamoto | H10N 70/8828 |
| | | | 257/3 |
| 2007/0200108 A1 * | 8/2007 | Noh | H10N 70/8828 |
| | | | 257/E29.17 |
| 2008/0050892 A1 | 2/2008 | Shin et al. | |
| 2008/0068879 A1 | 3/2008 | Ahn et al. | |
| 2009/0261313 A1 | 10/2009 | Lung et al. | |
| 2010/0072453 A1 | 3/2010 | Jeong et al. | |
| 2011/0073829 A1 | 3/2011 | Park et al. | |
| 2012/0307552 A1 | 12/2012 | Perniola et al. | |
| 2013/0181183 A1 | 7/2013 | Pellizzer et al. | |
| 2015/0295173 A1 | 10/2015 | Rigano | |
| 2016/0072059 A1 | 3/2016 | Kim et al. | |
| 2019/0165264 A1 | 5/2019 | Wu | |
| 2019/0334083 A1 | 10/2019 | Wu | |
| 2020/0013951 A1 | 1/2020 | Wu | |
| 2020/0052197 A1 | 2/2020 | Navarro et al. | |
| 2021/0257547 A1 | 8/2021 | Shen et al. | |

FOREIGN PATENT DOCUMENTS

| | | |
|---|---|---|
| CN | 105870323 A * | 8/2016 |
| CN | 110352379 A | 10/2019 |
| EP | 2706582 A1 | 3/2014 |
| KR | 20100063613 A | 6/2010 |
| WO | WO 2008068807 A1 | 6/2008 |

* cited by examiner

PHASE-CHANGE MEMORY CELL

BACKGROUND

Technical Field

The present disclosure relates generally to memory devices, and more specifically to phase-change memory cells.

Description of the Related Art

Phase-change materials are materials which can switch, under the effect of heat, between a crystalline phase and an amorphous phase. Since the electrical resistance of an amorphous material is significantly greater than the electrical resistance of a crystalline phase of the same material, such a phenomenon is used to define two memory states, for example, 0 and 1, differentiated by the resistance measured through the phase-change material. The most common phase-change materials used for manufacturing memories are alloys made up of germanium, of antimony, and of tellurium.

BRIEF SUMMARY

There is a need to improve existing phase-change memory cells in order to reliably achieve a number of memory states higher than two.

There is a need to improve existing phase-change memory cells in order to be less affected by problems of misalignment.

One embodiment addresses all or some of the drawbacks of known phase-change memory cells.

One embodiment provides a phase-change memory cell, comprising: a heater; a stack of at least one germanium layer or a nitrogen doped germanium layer and at least one layer of a first alloy made up of germanium, of antimony, and of tellurium; and a resistive layer, located between the heater and the stack.

According to an embodiment, side walls of said stack and of the resistive layer are surrounded by an insulating region.

According to an embodiment, the resistive layer extends under the entire bottom layer of the stack.

According to an embodiment, the resistive layer is in contact with the heater and the bottom layer of the stack.

According to an embodiment, the stack comprises a region in a second alloy made up of germanium, of antimony, and of tellurium, the second region extending from the resistive layer and through the germanium, or nitrogen doped germanium, layer, the second alloy having a higher germanium concentration than the first alloy.

According to an embodiment, a conductive layer rests on the top layer of the stack.

According to an embodiment, there is no portion of the germanium layer between the top of the region and the conductive layer.

According to an embodiment: a first memory state is defined by the region being entirely in a crystalline state; a second memory state is defined by having an amorphous region totally covering a top surface of said resistive layer; and at least one intermediate memory state is defined by having said amorphous region partially covering said top surface of said resistive layer.

Another embodiment provides a method of manufacturing the phase-change memory cell of any of the various embodiments described herein, comprising a step where a portion of the stack is heated up to a temperature sufficient for the portions of layers of germanium or nitrogen doped germanium and of the first alloy located in this portion to form a second alloy made up of germanium, of antimony, and of tellurium, the second alloy having a higher germanium concentration than the first alloy.

According to an embodiment, the method comprises a step of heating the region in order to reach one of at least three memory states.

According to an embodiment, the region is heated via the heater and the resistive layer.

According to an embodiment, the electrical resistance of said cell increases monotonically by increasing a part of the amorphous region that covers the top surface of said resistive layer.

Another embodiment provides a memory device comprising at least one memory cell as described.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front," "back," "top," "bottom," "left," "right," etc., or to relative positional qualifiers, such as the terms "above," "below," "higher," "lower," etc., or to qualifiers of orientation, such as "horizontal," "vertical," etc., reference is made to the orientation shown in the figures.

Unless specified otherwise, the expressions "around," "approximately," "substantially" and "in the order of" signify within 10%, and preferably within 5%.

Figure 1:
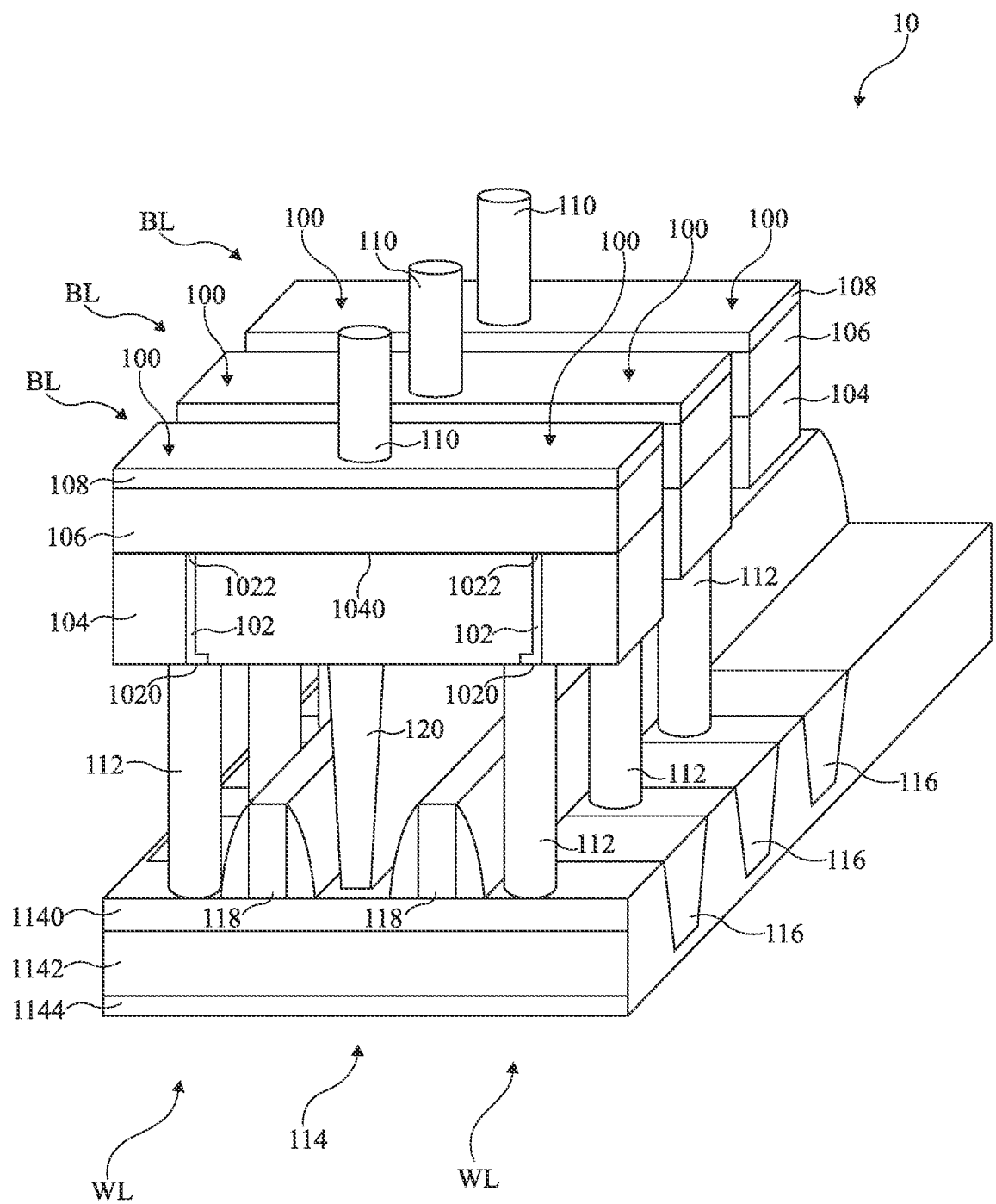
FIG. 1 is a simplified perspective view of an example of a phase-change memory device.

FIG. 1 is a simplified perspective view of an example of a phase-change memory device 10 comprising a plurality of memory cells 100.

Phase-change memory (PCM) cells, such as memory cells 100 depicted in FIG. 1, are typically embedded in non-volatile memory (NVM) devices such as electrically erasable programmable read-only memories (EEPROM). The programming of each memory cell in such memory devices is usually performed upon manufacturing of the memory devices and can afterwards be modified several times, particularly during their use.

As depicted in FIG. 1, the memory cells 100 of the memory device 10 are arranged in a grid-like or matrix pattern. In other words, the memory device 10 is composed of an array of memory cells 100. Each memory cell 100 is located at the intersection of a row and a column of the array. In FIG. 1, only three columns BL and two rows WL are shown.

The columns BL, which are parallel to each other and parallel to the plane of FIG. 1, will further be referred to as "bit lines" (BL). The rows, which are parallel to each other and perpendicular to the bit lines, will further be referred to as "word lines" (WL).

Each phase-change memory cell 100 of the memory device 10 comprises a heater 102 or resistive element. In the example of FIG. 1, the heater 102 has an L-shaped cross-section and therefore comprises an horizontal portion and a vertical portion.

The heater 102 is generally surrounded by an insulating or dielectric layer 104, which is for example composed of nitride and/or oxide, for example of silicon oxide or silicon nitride. The thickness of this insulating layer 104 is such that the upper surface 1022 of the vertical portion of the heater 102 is coplanar with the upper surface 1040 of the insulating layer 104.

Each memory cell 100 further comprises a layer 106. This layer 106 is made of a phase-change material. The layer 106 is formed and resting both on the upper surface 1040 of the insulating layer 104 and on the upper surface 1022 of the vertical portion of the heater 102.

A conductive metallic layer 108 rests on top of the layer 106. This conductive layer 108 typically forms an electrode of the memory cell 100.

In the example of FIG. 1, the memory cells 100 belonging to a given bit line share the same insulating layer 104, the same layer 106, and the same conductive layer 108. In the memory device 10, the layers 104, 106, and 108 thus extend laterally along the BL direction (to the left and to the right, in FIG. 1). All the memory cells 100 of a given bit line are consequently sharing a common electrode 108. Conductive vias 110 are provided for connecting each electrode 108 to a metallization level located above the memory cells 100 of the memory device 10.

The heater 102 of each memory cell 100 is typically connected, by its foot 1020 (that is to say a bottom surface of its horizontal portion), to a bottom contact 112 or pillar. This bottom contact 112 extends vertically and is connected to a substrate 114.

In the example of FIG. 1, the substrate 114 has a multi-layer structure, which is composed of three layers:
a first layer 1140 made of a thin silicon film, to which the bottom contacts 112 are connected;
a second layer 1142 made of a thin buried oxide; and
a third layer 1144 made of thick silicon wafer.

The substrate 114 also features shallow trench isolation (STI) 116 between the portions of the substrate in contact with the bottom contacts 112 belonging to adjacent bit lines. These shallow trench isolations 116 prevent electric current leakage between different bit lines of the memory device 10. In the memory device 10, the shallow trench isolations 116 thus extend laterally along the BL direction (to the left and to the right, in FIG. 1).

The bottom contact 112 of each memory cell 100 is connected to one terminal of a selection element. The selection element, often termed selector or access device, provides the ability to address/select individually each memory cell 100 of the memory device 10. In the example of FIG. 1, the selector of a memory cell 100 is a transistor the gate 118 of which receives a bias voltage. According to its value, this bias voltage allows the enabling or the disabling of a current flow between the electrode 108 and a conductive region 120 connected to the other terminal of the selection element and to a common reference potential, typically a ground potential.

In the example of FIG. 1, the select transistors of memory cells 100 belonging to a given word line or row share the same gate 118. In the memory device 10, the gates 118 and the region 120 thus extend longitudinally along the WL direction (to the front and to the back, in FIG. 1). All the select transistors of memory cells 100 of a given word line are consequently connected to a same gate 118.

Both the conductive layers 108 and the gates 118 hence form a matrix or grid-like pattern, in which each intersection is roughly vertically aligned with a memory cell 100.

The layer 106 happens to be natively, that is to say after manufacturing/fabricating the memory cell 100 and before the beginning of writing/programming operations, either in a wholly crystalline state/phase or in a partially crystalline state/phase. It is usual to perform a first electrical operation to set the layer 106 of all memory cells in a wholly crystalline state/phase. It is assumed, for example, that this crystalline phase corresponds to the logic value 1. In the phase-change memory 10 made of a plurality of memory cells 100, an initial state thus corresponds to all memory cells 100 having the same value 1. Data storage inside the phase-change memory 10 is then carried out by writing/programming some of its memory cells 100, while others of its memory cells 100 are left in their state (that is to say in a crystalline state).

For writing, or programming, into a given phase-change memory cell 100 of memory 10, this memory cell 100 is first selected by applying an appropriate voltage bias to the associated gate 118. An electrical current is then made to flow through the layer 106 by applying an appropriate electrical potential pulse between the associated electrode 108 and the common ground region 120. The electrical potential or the intensity of this electric current is carefully tuned so as to sufficiently increase the temperature of the heater 102 to heat, by Joule heating, an area of the layer 106 in contact with the upper end 1022 of the heater 102. This causes at least part of the phase-change material, which the layer 106 is made of, to melt. If the falling edge of the potential pulse is abrupt, at the end of the pulse, the electric current flow rapidly ends and, consequently, the local temperature rapidly decreases, quenching the glassy structure of the melted part of the phase-change material. As a result, the electrical pulse has transformed a part of the phase-change material from a low resistive crystalline phase to a highly resistive amorphous state. It is assumed, for example, that this amorphous state corresponds to the logic value 0.

For reading a given phase-change memory cell 100, this memory cell 100 is first selected by applying an appropriate voltage bias to the associated gate 118. A current, whose value is low enough to avoid any inadvertent phase change, is then made to flow through the cell 100 by applying an appropriate electrical potential between the associated electrode 108 and the common ground region 120. An electrical resistance, between the electrode 108 and the heater 102, can then be measured. This electrical resistance reflects the value, 0 or 1, that was previously stored in the memory cell 100.

A drawback of the memory device 10 as depicted in FIG. 1 comes from the fact that the layer 106 belongs not only to a single memory cell 100, but is instead shared by all memory cells 100 of a same bit line. This can lead to problems while programming a given memory cell 100, because of lateral heat diffusion that may disturb the amorphous state of adjacent cells of the same bit line. It can also lead to problems while reading a given memory cell 100, because alternate current pathways are easily provided by adjacent memory cells 100 of the same bit line. These problems are often referred to as "cross-talk" phenomena between adjacent memory cells.

Another drawback of the memory cell 100 depicted in FIG. 1 is that only two memory states (typically corresponding to a fully crystalline state and a fully amorphous state) can easily be achieved thanks to such a cell. In other words, only one bit of information can easily be stored in a memory cell 100. This is due to the fact that possible intermediate states are not stable because they undergo a resistance drift phenomenon, which typically leads to a resistance increase over time.

According to the embodiments disclosed below, the design of memory cell 100 is modified in order to address at least part of the above-mentioned drawbacks of known phase-change memory cells.

Figure 2A:
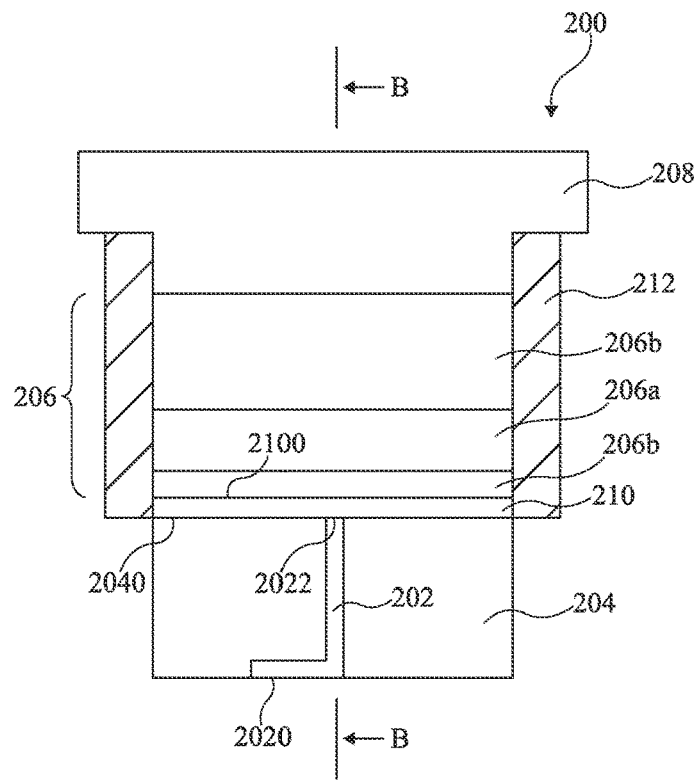
FIGS. 2A and 2B show two simplified cross-section views of an embodiment of a phase-change memory cell resulting from a step of manufacturing.
Figure 2B:
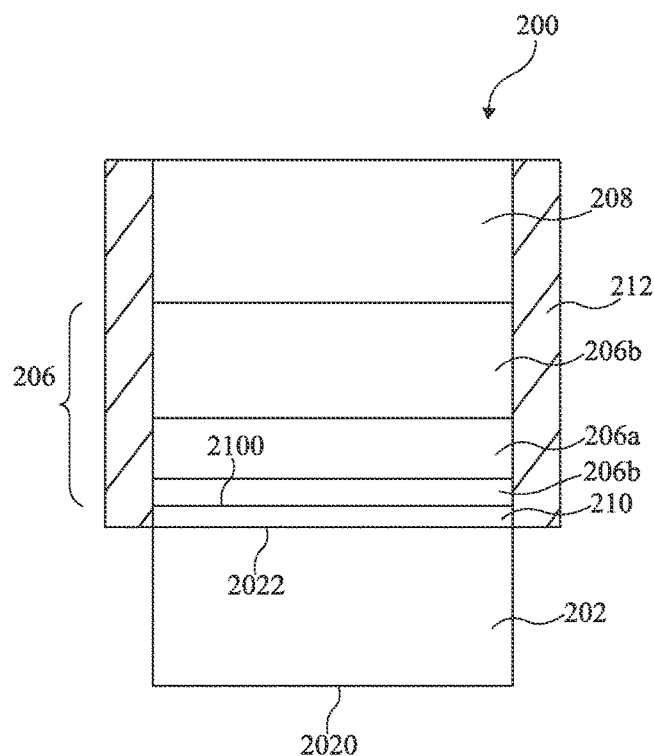

FIG. 2 shows two simplified cross-section views (FIG. 2A) and (FIG. 2B) of an embodiment of a phase-change memory cell 200 resulting from a step of manufacturing.

The view shown in FIG. 2B is a cross-sectional view, according to a cutting plane B-B, of the memory cell 200 depicted in the view of FIG. 2B.

The phase-change memory cell 200 comprises a heater 202 or resistive element. The heater 202 has, as shown in the view of FIG. 2A, an L-shaped cross-section. This heater 202 is connected, by its foot 2020 (that is to say a bottom surface of its horizontal portion), to a selection element (not shown in FIG. 2), for example, a transistor. The selection element provides the ability to individually address/select each memory cell 200 in a memory device comprising a matrix of memory cells 200.

The heater 202 is surrounded by an insulating layer 204. The thickness of this insulating layer 204 is such that the upper surface 2022 of the vertical portion of the heater 202 is coplanar with the upper surface 2040 of the insulating layer 204. The selection element (not shown in FIG. 2) is located beneath the insulating layer 204 and is electrically connected to the foot 2020 of the heater 202.

The memory cell 200 further comprises a stack 206 of layers 206a made of germanium or of nitrogen doped germanium and of layers 206b made of a first alloy of germanium, of antimony, and of tellurium. The layers of stack 206 are alternately layers 206a and layers 206b.

In the embodiment of FIG. 2, stack 206 comprises one germanium layer 206a and two layers 206b of the first alloy.

The lower layer of stack 206 is, in this example, one of layers 206b. Layer 206a is therefore located between the two layers 206b.

The first alloy is a stable alloy, that is, the proportions of the various components are close to stoichiometric. The first alloy is for example $Ge_2Sb_2Te_5$, $Ge_4Sb_4Te_7$ or an alloy made up of germanium, antimony and tellurium with atomic percentages close to, for example substantially equal to, the atomic percentages of $Ge_2Sb_2Te_5$ or $Ge_4Sb_4Te_7$. The first alloy of layers 206b is preferably in a crystalline phase. Layers 206a are for example made of non-doped germanium or of germanium doped with nitrogen atoms. In the case of layers 206a in germanium doped with nitrogen atoms, the nitrogen content is preferably lower than 35% of the atomic count. The material of layer 206a is for example in an amorphous phase.

The layers of stack 206, for example, have a thickness greater than approximately 4 nm, for example, in the range from 4 to 30 nm. Layers 206a and 206b may be of different thicknesses.

In some embodiment, the various layers 206b are made of different alloys of germanium, of antimony and of tellurium chosen among the example given previously for the first alloy. For example, the stack 206 may comprise a layer 206a of germanium situated between a layer 206b made of $Ge_2Sb_2Te_5$ and a layer 206b made of $Ge_4Sb_4Te_7$. Those different alloys will nonetheless be referred to as the first alloy in the following description.

More generally, stack 206 comprises at least one germanium layer 206a and at least one layer 206b made of the first alloy. Layer 206b preferably covers layer 206a. Preferably, stack 206 comprises a layer 206a located between two layers 206b made of the first alloy. Stack 206 may comprise any number of layers, greater than two. The number of layers may be even or odd. Furthermore, the lower layer of stack 206 may be a germanium layer 206a or a layer 206b made of the first alloy.

A conductive layer 208 rests on and is in contact with the stack 206, more specifically with the top layer of the stack (one of the layers 206b, in the example of FIG. 2). This conductive layer 208 typically forms an electrode (to be connected to the bit line) of the memory cell 200, while the heater 202 forms another electrode (to be connected to the word line) of the memory cell 200. The two electrodes are also referred to here as a "top" electrode 208 and a "bottom" electrode 202, though no limitation is implied as to the orientation of the memory cell 200 in operation.

In the example of the view shown in FIG. 2A, the top portion of the top electrode 208 extends horizontally along a direction orthogonal to the cutting plane BB. The heater 202 is preferably centered with respect to the memory cell 200.

According to a preferred embodiment, a resistive layer 210 is interposed between the insulating layer 204 and the stack 206. In other words:

the resistive layer 210 is formed and resting both on the upper surface 2040 of the insulating layer 204 and on the upper surface 2022 of the vertical portion of the heater 202, the layer 210 being in electrical contact with the heater 202; and the stack 206 is formed and resting on the upper surface 2100 of the resistive layer 210.

Preferably, the resistive layer 210 extends under the entire bottom layer of the stack 206.

The resistive layer 210 is for example made of any refractory metal and/or refractory metal nitride, such as titanium nitride (TiN), tantalum (Ta), tantalum nitride (TaN), or tungsten (W).

Side walls of the memory cell 200 are surrounded by an insulating region 212. All four lateral faces of both the stack 206 and the resistive layer 210 are, as shown in the views of FIGS. 2A and 2B, totally enclosed/wrapped by this insulating region 212, while only part of the conductive layer 208 is flanked by the insulating region 212. In a memory device (not shown in FIG. 2) made of an array of memory cells 200, this allows for the top electrode 208 to connect to the stack 206 of other memory cells 200 of a same bit line.

The memory cell described in relation with FIG. 2 corresponds to an intermediate state in the manufacturing process of the memory cell. A subsequent step, corresponding to a step of "Forming," is described in relation with FIG. 3.

Figure 3A:
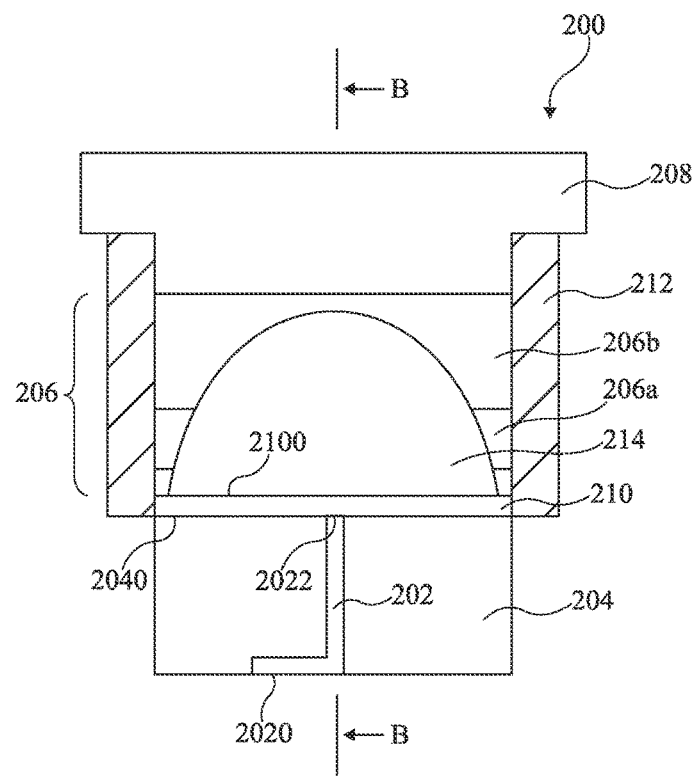
FIGS. 3A and 3B show two simplified cross-section views of an embodiment of a phase-change memory cell resulting from a step of manufacturing following the step of FIGS. 2A and 2B.
Figure 3B:
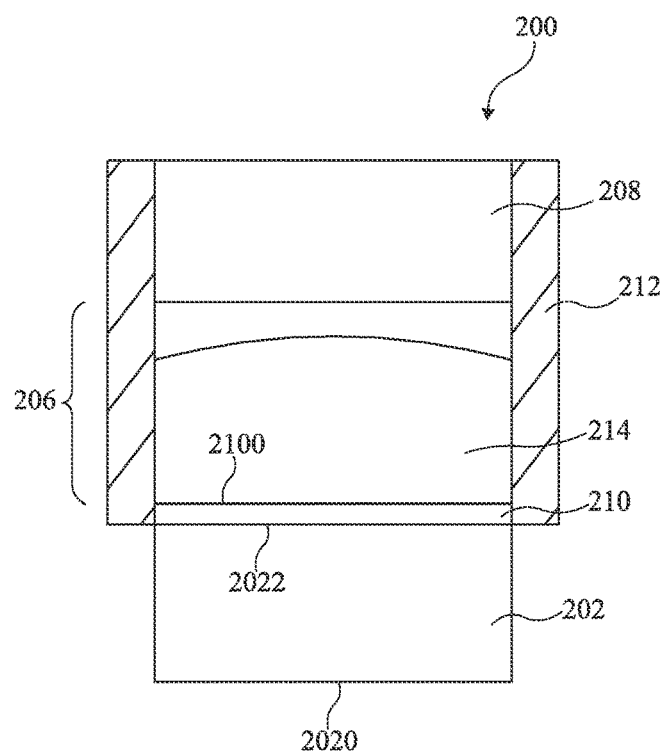

FIG. 3 shows two simplified cross-section views (FIG. 3A) and (FIG. 3B) of an embodiment of a phase-change memory cell resulting from a subsequent step of manufacturing.

The view shown in FIG. 3B is a cross-sectional view, according to a cutting plane B-B, of the memory cell 200 depicted in the view of FIG. 3A.

The step resulting in the memory cell 200 of FIG. 3 comprises an electrical operation called "Forming" carried out after the step resulting in the memory cell of FIG. 2. During this operation, a high current pulse, typically higher than the pulses normally applied for programming memory cells, flows between the top electrode 208 and the bottom electrode 202 and goes through resistive layer 210 and stack 206.

The resistive element 202 heats until a temperature is reached that is, for example higher than 600° C., preferably higher than 900° C., in order to melt a portion of the materials of layers 206a and 206b. This operation forms a portion 214 in a homogenous Ge-rich alloy from the melted portions of layers 206a and 206b. Portion 214 is the active zone of the phase change memory. Preferably, the "Forming" operation is performed in such a way that portion 214 is in the crystalline phase at the end of the operation.

The portion 214 rests on the upper surface of layer 210. The portion 214 is thus in electrical contact with resistive element 202, through the resistive layer 210. The portion 214 has the form of a dome, in other words it has a cross-section substantially in the shape of a half circle, or a circular portion, centered on the contact area between the resistive element 202 and the resistive layer 210. The portion 214 is centered on the contact area between the resistive element 202 and the resistive layer 210 no matter the position of said contact area. Therefore, misalignment problems regarding the formation of the resistive element 202 are negligible, as long as the resistive element is in contact with the resistive layer 210.

In the example of FIG. 3, the region 214 does not reach the layer 208. Indeed, the top of the region 214 is separated from the layer 208 by a portion of the layer 206b. More generally, the top of the region 214 can be separated from the layer 208 by a portion in the first alloy. Preferably, the top of the region 214, in other words the portion of the region 214 closest to the layer 208, is not separated from the layer 208 by a germanium layer. Alternatively, the region 214 can reach the layer 208.

Portion 214 is made of a second alloy made of up germanium, antimony, and tellurium, the germanium concentration of the second alloy being greater than that of the first alloy. The second alloy is, like the first alloy, a phase-change material, such as what has been previously described. The proportions of the components of the second alloy are for example not stoichiometric. The proportion of germanium in the second alloy is for example between 1.5 times and 3.5 times the proportion of germanium in the first alloy.

The quantity of germanium in the second alloy depends on the quantity of germanium in the heated portions, that is, on the number and on the thickness of germanium layers 206a, as compared with the quantity of the first alloy.

The data written, or programmed, into the memory cell are determined by the amorphous or crystalline phase of at least part of the portion 214. An example of the method of programming will be described in relation with FIG. 4.

Due to the presence of the insulating region 212, the memory cell 200 is referred to as a "fully confined cell." In a phase-change memory array (not shown), the insulating region 212 indeed acts like a galvanic insulation as well as a thermal barrier separating adjacent cells, thus avoiding interferences between cells. The cross-talk phenomena between adjacent memory cells, which have been described with reference to FIG. 1, can theoretically not occur in a fully-confined memory cell such as the memory cell 200 depicted in FIGS. 2 and 3.

Figure 4A:
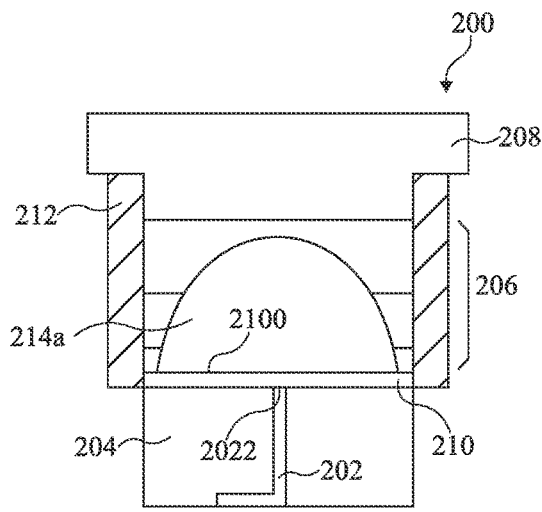
FIGS. 4A, 4B, and 4C show three simplified cross-sections views of various steps of a method of writing into a phase-change memory cell.
Figure 4B:
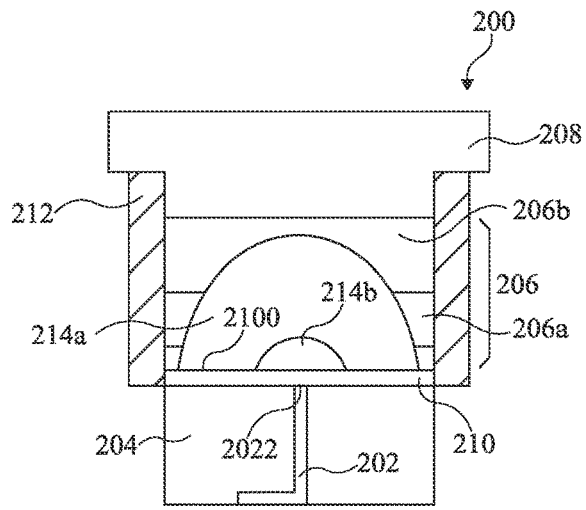
Figure 4C:
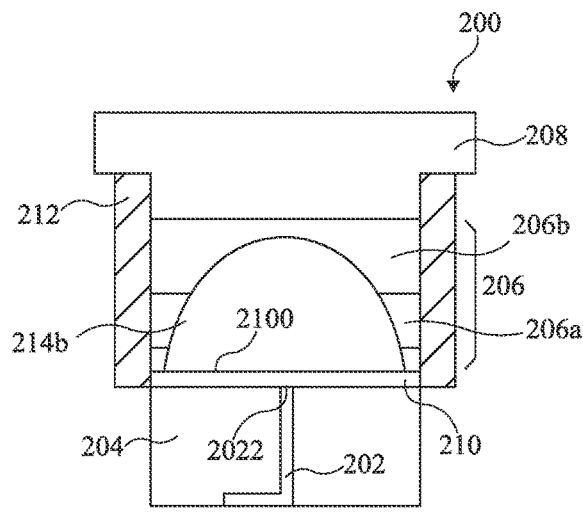

FIG. 4 shows three simplified cross-sections views (FIG. 4A), (FIG. 4B), and (FIG. 4C) of various steps of a method of writing into a phase-change memory cell such as the memory cell described in relation with FIG. 3.

The view shown in FIG. 4A depicts a PCM cell like the above-mentioned memory cell 200, whose region 214 exhibits a fully crystalline phase/structure. In other words, the region 214 is, in the view of FIG. 4A, wholly made of a crystalline phase/region 214a. This is the case, for example, before the beginning of writing operations into the memory cell 200.

For writing in the memory cell 200, a voltage is applied between the top electrode 208 (conductive layer) and the bottom electrode 202 (heater). This voltage gives rise to an electric current flowing through the region 214, which is initially wholly made of the crystalline phase 214a, and, if the region 214 does not reach the top electrode 208, through portion of the layer 206b located between the region 214 and the electrode 208. The memory cell 200 is thus heated, by the heater 202, up to a temperature sufficient to amorphize at least part of the crystalline region 214.

In the view shown in FIG. 4B, Joule heating due to the electric current flowing through the memory cell 200 makes part of the region 214 change phase, thereby forming an amorphous region 214b above the upper surface 2100 of the resistive layer 210. The amorphous region 214b forms a dome, which is vertically aligned with the upper surface 2022 of the vertical portion of the heater 202, which is centered with respect to the memory cell 200.

The second alloy of the amorphous region 214b located directly above the heater 202 has changed/switched phase, due to heating, from a crystalline phase to an amorphous state. The amorphous region 214b only partially covers, in the view of FIG. 4B, the upper/top surface 2100 of the resistive layer 210 (that is to say the surface of the resistive layer 210 that is in contact with the region 214). In the view of FIG. 4B, the region 214 is therefore made of both the amorphous region 214b, where the phase change took place upon heating, and the crystalline phase 214a, in which the phase change did not already happen.

Both the dome of the region 214a and the dome of the region 214b are centered on the contact between the upper surface 2022 of the vertical portion of the heater 202 and the resistive layer 210. Both domes are therefore automatically aligned. If the heater 202 is misaligned due to faults in the manufacturing process, in other words if the heater 202 is not centered, both domes are still aligned, as their position is dependent on the position of the resistive element. The behavior of the memory cell is therefore not impacted significantly.

If a memory cell like the memory cell 200 as depicted in the view of FIG. 4B is selected for reading and if the appropriate voltage bias is applied between the top electrode 208 and the bottom electrode 202, the electric current flows through the crystalline phase 214a, the part of resistive layer 210 covered by the amorphous phase and, potentially, the part of the layer 206b located between the top of the region 214 and the electrode 208. The electrical current flows through two parallel paths (not shown) so as to circumvent the amorphous region 214b. Each one of these two paths includes one of the two branches of the part of the resistive layer 210, these branches extending in an opposite direction from the upper surface 2022 of the heater 202, and are covered by the amorphous region 214a.

Due to the fact that the regions 214a and 214b are centered on the heater 202, these two paths have an equivalent electrical resistance. The resistivity and the thickness of the resistive layer 210 are such that the resistance of the memory cell 200 in the state depicted in the view of FIG. 4B is higher than the resistance of the memory cell 200 in the state depicted in the view of FIG. 4A. Moreover, as the resistance of the resistive layer 210 is stable over time, the cell in the state depicted in the view of FIG. 4B is almost free from the resistance drift problem.

It is assumed that the voltage, applied between the top electrode 208 and the bottom electrode 202, is subsequently raised in order to increase the intensity of the electric current flowing through the stack 206. This results in a temperature rise inside the stack 206, thus causing the phase change to carry on within the crystalline phase 214a. Part of the crystalline second alloy, contained inside the crystalline phase 214a, is therefore progressively converted into amorphous second alloy, which results in an extended amorphous region 214b.

Consequently, the extent of the part of the resistive layer 210 covered by the amorphous region 214b also enlarges and its resistance increases, roughly proportionally to a length of the part of surface 2100 that is covered by the amorphous region 214b. Therefore, the resistance of the cell also increases. This enables multilevel cell programming, with analog precision, and stable-over-time resistance values (no drift).

As shown in the view of FIG. 4C, the amorphization (that is to say the process during which crystalline second alloy is turned into amorphous second alloy) can lead to a situation where the region 214 exhibits a fully amorphous structure. Indeed, the heating has caused the region 214a to be completely replaced by the amorphous region 214b.

Thanks to the insulating region 212 surrounding the memory cell 200, all the electrically conductive paths that are theoretically possible pass through the stack 206. Considering the fact that the amorphous region 214b can be less conductive (or more resistive) than the crystalline region 214a by up to several orders of magnitude, the amorphous region 214b does not permit the creation of a conductive path through the region 214. Furthermore, outside the region 214, the stack comprises at least one layer 206a. The layer 206a has a high resistance, and therefore a low conductivity. As the layer 206a extends in regard of the entire resistive layer 210 outside of the region 214, there is no conductive path in the stack 206. There is substantially no conductive path left between the upper electrode 208 and the bottom electrode 202.

The two electrodes 202, 208 are hence fully isolated from each other thanks to the insulating region 212 and the amorphous regions 214b and 206a.

Based on the fact that, as previously shown, the electrical resistance increases as the amorphous region 214b grows, three memory states of the memory cell 200 are arbitrarily defined:
  a first memory state is defined by having no amorphous region 214b covering the upper surface 2100 of the resistive layer 210, as depicted in the view of FIG. 4A;
  a second memory state is defined by having the amorphous region 214b totally covering the upper surface 2100 of the resistive layer 210, as depicted in the view of FIG. 4C; and
  an intermediate memory state is defined by having the amorphous region 214b only partially covering the upper surface 2100 of the resistive layer 210, as depicted in the view of FIG. 4B.

A number of memory states higher than two, namely three memory states as depicted in FIG. 4, are thus advantageously achieved with the memory cell 200. This allows for a high-density storage of information in memory devices (not shown) comprising a plurality of PCM cells 200.

It is worth noting that the resistance of the memory cell 200 increases monotonically by increasing the part of the amorphous region 214b covering the top surface 2100 of the resistive layer 210. As the resistance of the state depicted in the view of FIG. 4B can hence be modulated in an analog way by increasing the programming current, multiple logic levels, for digital memory, and/or analog storage, may be considered for this memory state, in between the two extreme memory states depicted respectively in the views of FIGS. 4A and 4C.

Figure 5:
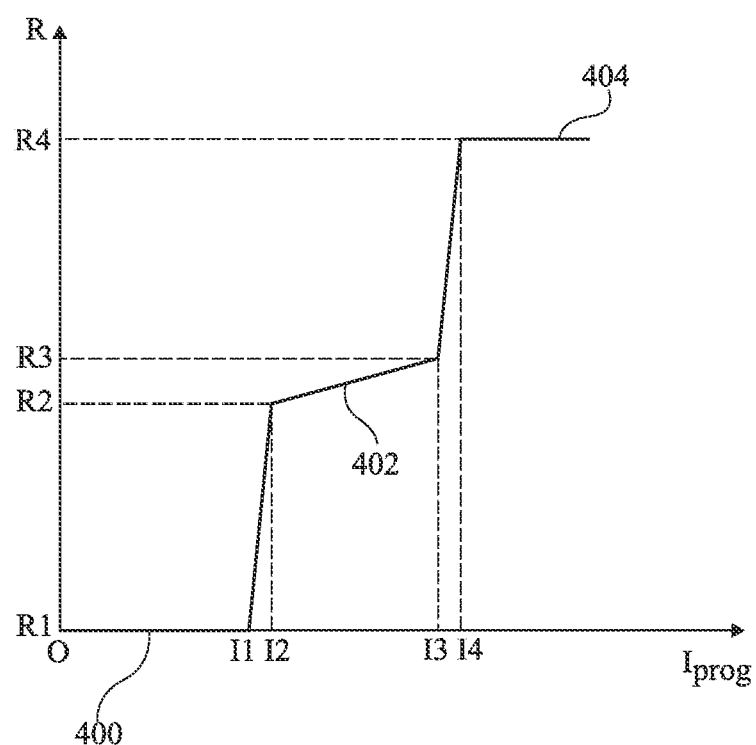
FIG. 5 is a diagram illustrating an example of variations of the resistance corresponding to several states of the phase-change memory cell.

FIG. 5 shows the resistance corresponding to several states of the phase-change memory cell. More precisely, FIG. 5 represents the resistance (R) between the top electrode 208 and the bottom electrode 202, as a function of the programming current ($I_{prog}$) flowing through the region 214, between the top electrode 208 and the bottom electrode 202 during a programming step.

The curve of the resistance R comprises three plateaus 400, 402 and 404. Each plateau corresponds to at least one value stored by the phase-change memory cell.

The plateau 400 corresponds to a programming current comprised between 0 and a current value I1. The resistance R corresponding to this current range is substantially constant and substantially equal to a resistance value R1.

The plateau 400 corresponds to a region 214 entirely in the crystalline phase or in a substantially uniform crystalline phase, as it is represented in the view of FIG. 4A. For a programming current less than I1, the temperature generated by the resistive element 202 and the resistive layer 210 is not high enough to change the phase of the region 214. In other words, the region 214 does not comprise an amorphous region 214b. Therefore, the measurement, between the top electrode 208 and the bottom electrode 202 of a resistance substantially equal to R1 signifies that the memory cell is in the first memory state.

The plateau 402 corresponds to a programming current comprised between a value I2 and a value I3. The resistance R corresponding to this range of current increases monotonically from a value R2 to a value R3.

The plateau 402 corresponds to a region 214 partially in a crystalline phase and partially in an amorphous phase, as represented in the view of FIG. 4B. For a programming current between I2 and I3, the temperature generated by the resistive element 202 and the resistive layer 210 is high enough to change the phase of part of the region 214. In other words, the region 214 comprises the amorphous region 214b. Therefore, the measurement, between the top electrode 208 and the bottom electrode 202 of a resistance in the range from R2 to R3 signifies that the memory cell is in the second memory state.

As previously explained, the second memory state corresponds either to a single stored value, different from the stored value of the first memory state, or to multiple logic levels obtained by modulating in an analog way the resistance between the values R2 and R3.

The plateau 404 corresponds to a programming current greater than a current value I4. The resistance R corresponding to this current range is substantially constant and substantially equal to a value R4 of resistance.

The plateau 404 corresponds to a region 214 entirely in the amorphous phase, as represented in the view of FIG. 4C. For a programming current higher than I4, the temperature generated by the resistive element 202 and the resistive layer 210 is high enough to change the phase of the entire region 214. In other words, the region 214 does not comprise a crystalline region 214a. Therefore, the measurement, between the top electrode 208 and the bottom electrode 202 of a resistance substantially equal to R4 signifies that the memory cell is in the third memory state.

The resistance values between R1 and R2 and between R3 and R4, corresponding respectively to a programming current between I1 and I2 and between I3 and I4, do not correspond to a memory state. In other words, if the resistance R between the top electrode 208 and the bottom electrode 202 is between R1 and R2 or between R3 and R4, there is no value stored in the memory cell. These current values are not used to program the memory cell.

The gradient of the plateau 402 is for example less than 5. Similarly, the gradients of the plateaus 400 and 404 are for example less than 2. The gradient of the region corresponding to resistance values between R1 and R2 is for example between 2 and 5 and the gradient of the region corresponding to resistance values between R3 and R4 is for example more than 5. This difference in gradient permits to distinguish the various regions of the curve, and therefore the various memory states.

The current value I4 is higher than the current value I3. The current value I3 is higher than the current value I2. The current value I2 is higher than the current value I1. Furthermore, the resistance value R4 is higher than the resistance value R3. The resistance value R3 is higher than the resistance value R2. The resistance value R2 is higher than the resistance value R1.

Figure 6:
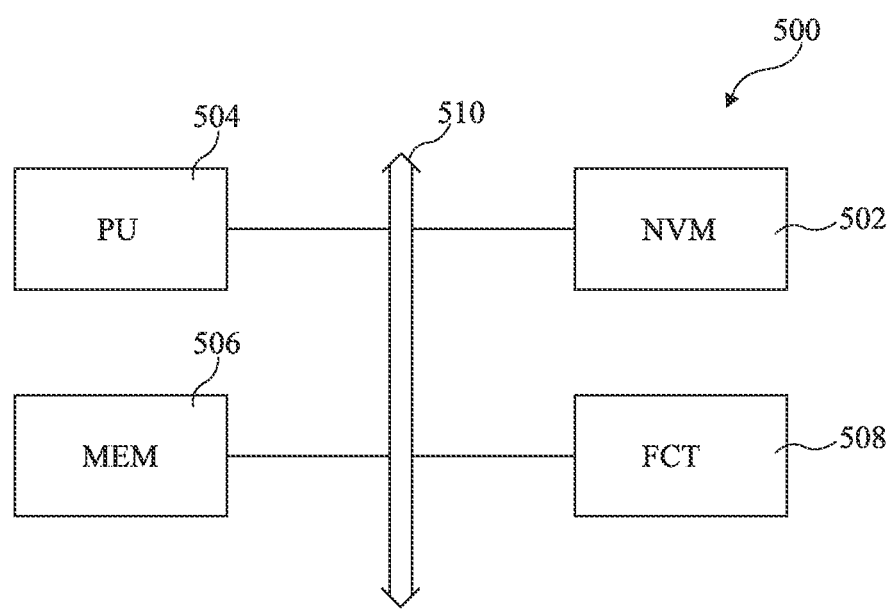
FIG. 6 schematically shows an embodiment of a memory.

FIG. 6 schematically illustrates an embodiment of a memory 500.

The memory 500 comprises:
one or a plurality of memory devices, such as devices comprising memory cells 200 and/or 300 previously described, and shown in FIG. 6 by a block 502 (NVM);
a data processing unit, represented by a block 504 (PU), for example, a microprocessor;
one or a plurality of memory devices, represented by a block 506 (MEM), and which may be memory devices different from those of block 502;
a block 508 (FCT) comprising other electronic functions, for example, sensors, load control circuits, etc.; and
a data bus 510 enabling to transfer data between the different components.

The block 502 preferably includes a circuit for addressing the array of memory cells 200.

It is possible that the memory devices of the block 506 are not phase-change memory devices, but RAMs, reprogrammable volatile memories (EEPROM, flash, etc.).

As an alternative, the block 506 may be omitted. The memory devices of the memory 500 are then only memory devices such as memory devices comprising memory cells 200. The memory is then entirely a non-volatile memory.

An advantage of the embodiments described herein is that the value stored by the memory cell is one of at least three different values.

Another advantage of the embodiments described herein is that the memory cell comprises a state in which the memory cell can take multiple logic levels obtained by modulating in an analog way the resistance between the top and bottom electrodes.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

The various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A phase-change memory cell, comprising:
   a heater;
   a stack including:
      a layer including germanium; and
      a first alloy including germanium, antimony, and tellurium;
      a second alloy including germanium, antimony, and tellurium, the second alloy having a higher germanium concentration than the first alloy;
   a resistive layer between the heater and the stack, the second alloy extending from the resistive layer and through the layer;
   a conductive layer in contact with a top surface of the stack; and
   an insulating region laterally surrounding and in contact with sidewalls of the stack and sidewalls of a lower portion of the conductive layer, an upper portion of the conductive layer being positioned on top of the insulating region.

2. The phase-change memory cell of claim 1, wherein the layer includes nitrogen doped germanium layer.

3. The phase-change memory cell of claim 1, wherein the insulating region laterally surrounds side walls of the resistive layer.

4. The phase-change memory cell of claim 1, wherein the resistive layer is in contact with the heater and a bottom layer of the stack.

5. A device, comprising:
   a phase-change memory cell including:

an insulating layer;
a heater in the insulating layer;
a resistive layer on the insulating layer and on the heater;
a stack of layers on the resistive layer, each layer in the stack including germanium;
a conductive layer in contact with a top surface of the stack; and
an insulating region on the resistive layer and laterally surrounding and in contact with sidewalls of the stack and sidewalls of a lower portion of the conductive layer, an upper portion of the conductive layer being positioned on top of the insulating region.

6. The device of claim 5 wherein the stack of layers includes a first layer, a second layer, and a third layer.

7. The device of claim 6 wherein the first layer is on the resistive layer and the second layer is on the first layer.

8. The device of claim 7 wherein the first layer includes an alloy with germanium, antimony, and tellurium.

9. The device of claim 8 wherein the third layer includes the alloy.

10. The device of claim 9 wherein the heater is L-shaped.

11. A device, comprising:
a phase-change memory cell, including:
a heater;
a stack including:
a first alloy layer including germanium, antimony, and tellurium;
a layer that includes germanium on the first alloy layer;
a second alloy layer including germanium, antimony, and tellurium, the second alloy layer on the layer, the second alloy layer having a higher germanium concentration than the first alloy layer; and
a resistive layer between the heater and the stack;
a conductive layer in contact with a top surface of the stack; and
an insulating region in contact with sidewalls of the stack and a sidewall of a lower portion of the conductive layer, an upper portion of the conductive layer being positioned on top of the insulating region.

12. The device of claim 11 wherein the layer includes nitrogen doped germanium.

13. The device of claim 12 wherein the heater is L-shaped.

14. The device of claim 11, wherein the resistive layer extends completely under an entire bottom layer of the stack.

15. The device of claim 14, wherein the resistive layer is in contact with the heater and a bottom layer of the stack.

16. The device of claim 11, wherein the resistive layer includes a refractory metal.

17. The phase-change memory cell of claim 1, wherein the resistive layer includes a refractory metal.

18. The device of claim 5, wherein the resistive layer includes a refractory metal.

* * * * *